United States Patent
Li et al.

(10) Patent No.: US 9,481,811 B2
(45) Date of Patent: Nov. 1, 2016

(54) COMPOSITION AND METHOD FOR POLISHING MEMORY HARD DISKS EXHIBITING REDUCED EDGE ROLL-OFF

(71) Applicant: Cabot Microelectronics Corporation, Aurora, IL (US)

(72) Inventors: Tong Li, Singapore (SG); Hon-Wu Lau, Singapore (SG); Michael White, Ridgefield, CT (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 14/627,081

(22) Filed: Feb. 20, 2015

(65) Prior Publication Data

US 2016/0244639 A1    Aug. 25, 2016

(51) Int. Cl.
| | |
|---|---|
| *C09G 1/04* | (2006.01) |
| *B24B 1/00* | (2006.01) |
| *C09G 1/02* | (2006.01) |
| *B24B 37/04* | (2012.01) |
| *H01L 21/321* | (2006.01) |
| *H01L 21/306* | (2006.01) |
| *C09K 3/14* | (2006.01) |

(Continued)

(52) U.S. Cl.
CPC . *C09G 1/04* (2013.01); *B24B 1/00* (2013.01); *B24B 37/044* (2013.01); *C09G 1/00* (2013.01); *C09G 1/02* (2013.01); *C09G 1/06* (2013.01); *C09K 3/1454* (2013.01); *C09K 3/1463* (2013.01); *C09K 13/06* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | |
|---|---|---|
| 6,280,490 B1 | 8/2001 | Rader et al. |
| 6,293,848 B1 | 9/2001 | Fang et al. |

(Continued)

FOREIGN PATENT DOCUMENTS

WO    WO 2010/141652 A2    12/2012

OTHER PUBLICATIONS

De Laat et al., "A comparative study of the effects of chloride, sulfate and nitrate ions on the rates of decomposition of $H_2O_2$ and organic compounds by $Fe(II)/H_2O_2$ and $Fe(III)/H_2O_2$," *Chemosphere*, 55: 715-723 (2004).

*Primary Examiner* — Jiong-Ping Lu
(74) *Attorney, Agent, or Firm* — Thomas Omholt; Francis J. Koszyk

(57) ABSTRACT

The invention provides a chemical-mechanical polishing composition containing (a) an abrasive selected from wet-process silica, alpha alumina, fumed alumina, ceria, zirconia, titania, and combinations thereof, (b) an oxidation catalyst, (c) a non-transition metal sulfate salt, (d) a complexing agent, (e) hydrogen peroxide, (f) a nonionic surfactant, (g) an anionic surfactant, and (h) water. The polishing composition has a pH of about 1 to about 5, and the polishing composition is substantially free of a peroxydisulfate salt. The invention also provides a method of chemically-mechanically polishing a substrate, especially a nickel-phosphorous substrate, by contacting a substrate with a polishing pad and the chemical-mechanical polishing composition, moving the polishing pad and the polishing composition relative to the substrate, and abrading at least a portion of the substrate to polish the substrate.

26 Claims, 1 Drawing Sheet

(51) Int. Cl.
*C09K 13/06* (2006.01)
*C09G 1/00* (2006.01)
*C09G 1/06* (2006.01)

(56) References Cited

U.S. PATENT DOCUMENTS

| | | | |
|---|---|---|---|
| 6,632,377 | B1 | 10/2003 | Brusic et al. |
| 6,812,193 | B2 | 11/2004 | Brigham et al. |
| 2002/0066234 | A1 | 6/2002 | Cote et al. |
| 2006/0084271 | A1* | 4/2006 | Yang ................. C09G 1/02 438/692 |
| 2009/0173717 | A1* | 7/2009 | Palanisamy Chinnathambi ......... C09G 1/02 216/89 |
| 2010/0178768 | A1 | 7/2010 | Li |
| 2011/0203186 | A1* | 8/2011 | Oshima ................. B24B 37/044 51/298 |

* cited by examiner

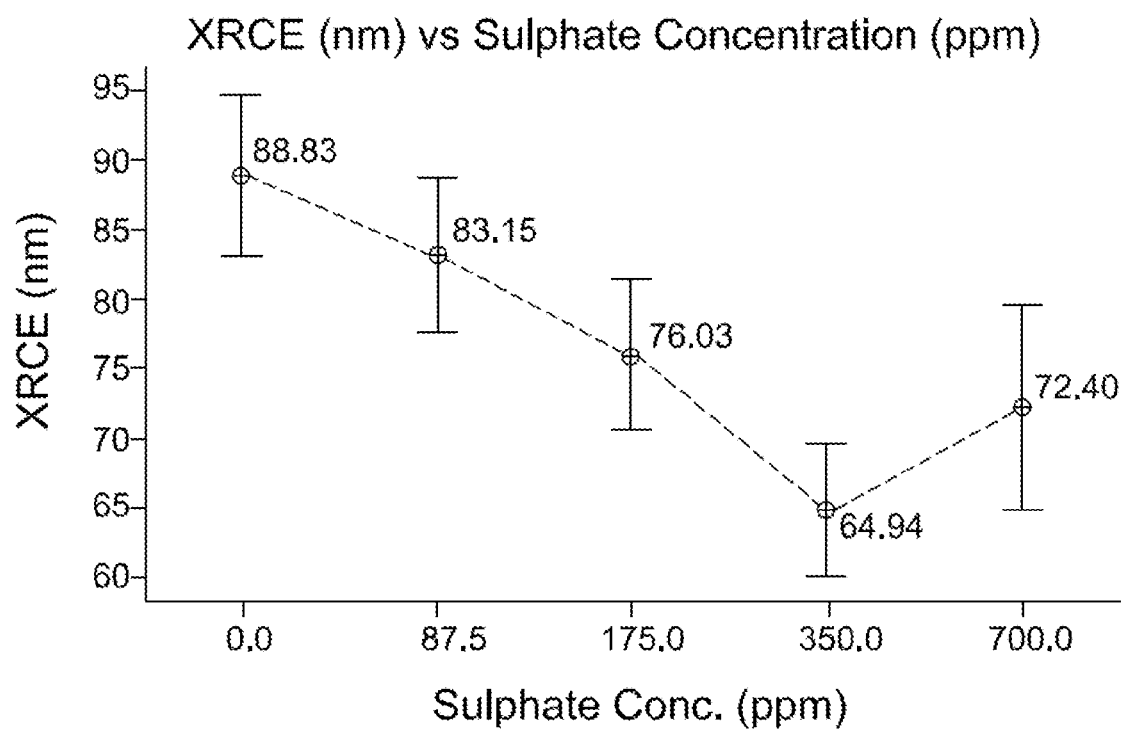

COMPOSITION AND METHOD FOR POLISHING MEMORY HARD DISKS EXHIBITING REDUCED EDGE ROLL-OFF

BACKGROUND OF THE INVENTION

The demand for increased storage capacity in memory or rigid disks and the trend towards miniaturization of memory or rigid disks (due to the requirement for smaller hard drives in computer equipment) continues to emphasize the importance of the memory or rigid disk manufacturing process, including the planarization or polishing of such disks for ensuring maximal performance. While there exist several chemical-mechanical polishing (CMP) compositions and methods for use in conjunction with semiconductor device manufacture, few conventional CMP methods or commercially available CMP compositions are well-suited for the planarization or polishing of memory or rigid disks.

As the demand for increased storage capacity has increased, so has the need for improved processes for the polishing of such memory or rigid disks. The term "memory or rigid disk" refers to any magnetic disk, hard disk, rigid disk, or memory disk for retaining information in electromagnetic form. The memory or rigid disk typically has a surface that comprises nickel-phosphorus, but the memory or rigid disk surface can comprise any other suitable material. The planarity of the memory or rigid disks must be improved, as the distance between the recording head of a disk drive and the surface of the memory or rigid disk has decreased. Reduction of defectivity of the memory or rigid disk, that is, the reduction of surface roughness, is necessary to increase recording density. In order to increase recording density, recording density per unit area on the memory or rigid disk must also be increased.

During the polishing of a memory or rigid disk, typically the edges of the disk receive a higher pressure from the polishing tool than the remaining surface area of the disk. Typically, polishing is performed using a combination of an abrasive, a polishing pad, and a liquid carrier, in which the abrasive may be suspended in the liquid carrier, or may be affixed to the surface of the pad. As the polishing process mainly consists of mechanical abrasion of the disk by the abrasive and/or pad, in conjunction with the action of chemicals that may be present, and the rate of abrasion is at least in part a function of pressure applied, the edges of the disk experience a higher rate of abrasion than the rest of the disk. This leads to the formation of a curved, or rounded, contour at the edges of the disk, known in the art as rub-off or dub-off. Such rounded areas on a disk are unsuitable for recording. Thus, if the amount of rub-off can be reduced, the recording capacity for a disk can be increased.

BRIEF SUMMARY OF THE INVENTION

The invention provides a chemical-mechanical polishing composition comprising (a) an abrasive selected from wet-process silica, alpha alumina, fumed alumina, ceria, zirconia, titania, and combinations thereof, (b) an oxidation catalyst selected from ferrous sulfate, ferric sulfate, ferrous perchlorate, manganese (II) sulfate, manganese (II) nitrate, copper(II) sulfate, copper(II) nitrate, cobalt (II) sulfate, cobalt (II) nitrate, nickel (II) sulfate, nickel (II) nitrate, zinc (II) sulfate, zinc (II) nitrate, and combinations thereof, (c) a non-transition metal sulfate salt, (d) a complexing agent, (e) hydrogen peroxide, (f) a nonionic surfactant, (g) an anionic surfactant, and (h) water, wherein the polishing composition has a pH of about 1 to about 5, and wherein the polishing composition is substantially free of a peroxydisulfate salt.

The invention also provides a chemical-mechanical polishing composition comprising (a) an abrasive selected from wet-process silica, alpha alumina, fumed alumina, ceria, zirconia, titania, and combinations thereof, (b) an oxidation catalyst selected from ferrous sulfate, ferric sulfate, ferric nitrate, ferrous perchlorate, manganese (II) sulfate, manganese (II) nitrate, copper(II) sulfate, copper(II) nitrate, cobalt (II) sulfate, cobalt (II) nitrate, nickel (II) sulfate, nickel (II) nitrate, zinc (II) sulfate, zinc (II) nitrate, and combinations thereof, (c) sodium sulfate, (d) a complexing agent, (e) hydrogen peroxide, (f) a nonionic surfactant, (g) an anionic surfactant, and (h) water, the polishing composition has a pH of about 1 to about 5, and wherein the polishing composition is substantially free of a peroxydisulfate salt.

The invention further provides a method of chemically-mechanically polishing a substrate comprising (i) contacting a substrate with a polishing pad and a chemical-mechanical polishing composition comprising (a) an abrasive selected from wet-process silica, alpha alumina, fumed alumina, ceria, zirconia, titania, and combinations thereof, (b) an oxidation catalyst selected from ferrous sulfate, ferric sulfate, ferrous perchlorate, manganese (II) sulfate, manganese (II) nitrate, copper(II) sulfate, copper(II) nitrate, cobalt (II) sulfate, cobalt (II) nitrate, nickel (II) sulfate, nickel (II) nitrate, zinc (II) sulfate, zinc (II) nitrate, and combinations thereof, (c) a non-transition metal sulfate salt, (d) a complexing agent, (e) hydrogen peroxide, (f) a nonionic surfactant, (g) an anionic surfactant, and (h) water, wherein the polishing composition has a pH of about 1 to about 5, and wherein the polishing composition is substantially free of a peroxydisulfate salt, (ii) moving the polishing pad and the chemical-mechanical polishing composition relative to the substrate, and (iii) abrading at least a portion of the substrate to polish the substrate.

The invention additionally provides a method of chemically-mechanically polishing a substrate comprising (i) contacting a substrate with a polishing pad and a chemical-mechanical polishing composition comprising (a) an abrasive selected from wet-process silica, alpha alumina, fumed alumina, ceria, zirconia, titania, and combinations thereof, (b) an oxidation catalyst selected from ferrous sulfate, ferric sulfate, ferric nitrate, ferrous perchlorate, manganese (II) sulfate, manganese (II) nitrate, copper(II) sulfate, copper(II) nitrate, cobalt (II) sulfate, cobalt (II) nitrate, nickel (II) sulfate, nickel (II) nitrate, zinc (II) sulfate, zinc (II) nitrate, and combinations thereof, (c) sodium sulfate, (d) a complexing agent, (e) hydrogen peroxide, (f) a nonionic surfactant, (g) an anionic surfactant, and (h) water, wherein the polishing composition has a pH of about 1 to about 5, and wherein the polishing composition is substantially free of a peroxydisulfate salt, (ii) moving the polishing pad and the chemical-mechanical polishing composition relative to the substrate, and (iii) abrading at least a portion of the substrate to polish the substrate.

BRIEF DESCRIPTION OF THE DRAWING

FIG. 1 depicts the relationship of extreme radius curvature (XRCE) to sulfate ion content in the polishing of nickel-phosphorous-coated aluminum disks with a polishing composition comprising manganese (II) nitrate.

DETAILED DESCRIPTION OF THE INVENTION

The invention provides a chemical-mechanical polishing composition comprising (a) an abrasive selected from wet-process silica, alpha alumina, fumed alumina, ceria, zirconia, titania, and combinations thereof, (b) an oxidation catalyst selected from ferrous sulfate, ferric sulfate, ferric nitrate, ferrous perchlorate, manganese (II) sulfate, manganese (II) nitrate, copper(II) sulfate, copper(II) nitrate, cobalt (II) sulfate, cobalt (II) nitrate, nickel (II) sulfate, nickel (II) nitrate, zinc (II) sulfate, zinc (II) nitrate, and combinations thereof, (c) a non-transition metal sulfate salt, (d) a complexing agent, (e) hydrogen peroxide, (f) a nonionic surfactant, (g) an anionic surfactant, and (h) water, wherein the polishing composition has a pH of about 1 to about 5, and wherein the polishing composition is substantially free of a peroxydisulfate salt.

The polishing composition comprises an abrasive selected from wet-process silica, alpha alumina, fumed alumina, ceria, zirconia, titania, silicon nitride, and combinations thereof. In an embodiment, the abrasive comprises, consists essentially of, or consists of wet-process silica. In another embodiment, the abrasive comprises, consists essentially of, or consists of a mixture of fumed alumina, alpha alumina, and wet-process silica.

The wet-process silica can be any suitable wet-process silica. For example, the wet-process silica can be condensation-polymerized silica. Condensation-polymerized silica particles typically are prepared by condensing $Si(OH)_4$ to form colloidal particles, where colloidal is defined as having an average particle size between about 1 nm and about 1000 nm. Such abrasive particles can be prepared in accordance with U.S. Pat. No. 5,230,833 or can be obtained as any of various commercially available products, such as the Akzo-Nobel Bindzil 50/80 product and the Nalco 1050, 1060, 2327, and 2329 products, as well as other similar products available from DuPont, Bayer, Applied Research, Nissan Chemical, Fuso, and Clariant.

Fumed alumina is an amorphous form of aluminum oxide, whereas alpha alumina refers to a crystalline polymorph of aluminum oxide formed at high temperatures above 1400° C. Alpha alumina typically refers to alumina comprising about 50 wt. % or more of the alpha polymorph. As used herein, the amount of alpha alumina in the polishing composition refers to the total weight of crystalline alumina present therein, wherein about 50 wt. % or more of the crystalline alumina comprises the alpha polymorph. Fumed alumina is typically less abrasive than alpha alumina. Both forms of alumina are well known in the art and available commercially in a wide range of particle sizes and surface areas.

The ceria, zirconia, and titania can be any suitable ceria, zirconia, and titania, respectively. For example, the ceria, zirconia, and titania can be wet-processed or fumed ceria, zirconia, and titania, respectively.

The wet-process silica, ceria, zirconia, or titania can have any suitable average particle size (i.e., average particle diameter). The abrasive can have an average particle size of about 5 nm or more, e.g., about 10 nm or more, about 15 nm or more, about 20 nm or more, about 25 nm or more, about 30 nm or more, about 35 nm or more, or about 40 nm or more. Alternatively, or in addition, the abrasive can have an average particle size of about 60 nm or less, e.g., about 55 nm or less, or about 50 nm or less, or about 45 nm or less. Thus, the abrasive can have a maximum in a particle size distribution bounded by any two of the above endpoints. For example, the abrasive can have an average particle size of about 5 nm to about 60 nm, about 10 nm to about 60 nm, about 15 nm to about 60 nm, about 20 nm to about 60 nm, about 20 nm to about 55 nm, about 20 nm to about 50 nm, about 20 nm to about 45 nm, about 25 nm to about 60 nm, about 25 nm to about 55 nm, about 25 nm to about 50 nm, about 30 nm to about 60 nm, about 30 nm to about 55 nm, about 30 nm to about 50 nm, about 35 nm to about 60 nm, about 35 nm to about 55 nm, about 35 nm to about 50 nm, about 40 nm to about 60 nm, or about 40 nm to about 55 nm.

The fumed alumina can have any suitable average particle size (i.e., average particle diameter). The fumed alumina can have an average particle size of about 30 nm or more, e.g., about 40 nm or more, about 50 nm or more, about 60 nm or more, about 70 nm or more, about 80 nm or more, about 90 nm or more, or about 100 nm or more. Alternatively, or in addition, the fumed alumina can have an average particle size of about 250 nm or less, e.g., about 230 nm or less, 210 nm or less, 190 nm or less, 170 nm or less, or 150 nm or less. Thus, the fumed alumina can have an average particle size bounded by any two of the above endpoints. For example, the fumed alumina can have an average particle size of about 30 nm to about 250 nm, about 80 nm to about 250 nm, about 80 nm to about 210 nm, or about 100 nm to about 150 nm.

The alpha alumina can have any suitable average particle size (i.e., average particle diameter). The alpha alumina can have an average particle size of about 100 nm or more, e.g., about 150 nm or more, about 200 nm or more, about 250 nm or more, about 300 nm or more, about 350 nm or more, about 400 nm or more, or about 450 nm or more. Alternatively, or in addition, the alpha alumina can have an average particle size of about 800 nm or less, e.g., about 750 nm or less, 650 nm or less, 600 nm or less, 550 nm or less, about 500 nm or less, about 450 nm or less, or about 400 nm or less. Thus, the alpha alumina can have an average particle size bounded by any two of the above endpoints. For example, the alpha alumina can have an average particle size of about 100 nm to about 800 nm, about 150 nm to about 800 nm, about 150 nm to about 500 nm, about 150 nm to about 400 nm, about 200 nm to about 300 nm, about 400 nm to about 800 nm, about 400 nm to about 700 nm, or about 400 nm to about 600 nm.

The particle size of an abrasive particle is the diameter of the smallest sphere that encompasses the abrasive particle.

The polishing composition can comprise any suitable amount of the abrasive. Typically, the polishing composition can contain about 0.01 wt. % or more, e.g., about 0.05 wt. % or more, about 0.1 wt. % or more, about 0.2 wt. % or more, about 0.3 wt. % or more, about 0.4 wt. % or more, or about 0.5 wt. % or more, of the abrasive. Alternatively, or in addition, the polishing composition can contain about 10 wt. % or less, e.g., about 9 wt. % or less, about 8 wt. % or less, about 7 wt. % or less, about 6 wt. % or less, about 5 wt. % or less, about 4 wt. % or less, about 3 wt. % or less, about 2 wt. % or less, or about 1 wt. % or less, of the abrasive. Thus, the polishing composition can comprise the abrasive in amounts bounded by any two of the above endpoints recited for the abrasive. For example the polishing composition can comprise about 0.01 wt. % to about 10 wt. %, about 0.05 wt. % to about 8 wt. %, about 0.1 wt. % to about 6 wt. %, about 0.2 wt. % to about 4 wt. %, about 0.2 wt. % to about 2 wt. %, or about 0.3 wt. % to about 1 wt. % of the abrasive.

When the polishing composition comprises a mixture of fumed alumina, alpha alumina, and wet-process silica, the fumed alumina, alpha alumina, and wet-process silica can be present in any suitable ratio. Typically, the polishing composition can contain about 0.01 wt. % or more e.g., about 0.05 wt. % or more, about 0.1 wt. % or more, or about 0.2 wt. % or more, of fumed alumina, about 0.1 wt. % or more, e.g., about 0.2 wt. % or more, about 0.3 wt. % or more, about 0.4 wt. % or more, or about 0.5 wt. % or more, of alpha alumina, and about 0.1 wt. % or more, e.g., about 0.2 wt. % or more, about 0.3 wt. % or more, about 0.4 wt. % or more, or about 0.5 wt. % or more, of wet-process silica. Alternatively, or in addition, the polishing composition can contain about 1 wt. % or less, e.g., about 0.9 wt. % or less, about 0.8 wt. % or less, about 0.7 wt. % or less, about 0.6 wt. % or less, or about 0.5 wt. % or less of fumed alumina, about 5 wt. % or less, e.g., about 4 wt. % or less, about 3 wt. % or less, or about 2 wt. % or less of alpha alumina, and about 3 wt. % or less, e.g., about 2 wt. % or less, or about 1 wt. % or less of wet-process silica. Thus, the polishing composition can comprise a mixture of fumed alumina, alpha alumina, and wet-process silica in amounts bounded by any two of the above endpoints recited for each of fumed alumina, alpha alumina, and wet-process silica. For example the polishing composition can comprise about 0.01 wt. % to about 1 wt. %, 0.1 wt. % to about 0.8 wt. %, or about 0.2 wt. % to about 0.6 wt. %, of fumed alumina, about 0.1 wt. % to about 5 wt. %, about 0.5 wt. % to about 3 wt. %, or about 1 wt. % to about 2 wt. %, of alpha alumina, and about 0.1 wt. % to about 3 wt. %, about 0.2 wt. % to about 2 wt. %, or about 0.5 wt. % to about 1 wt. %, of wet-process silica.

The abrasive comprises particles which are preferably colloidally stable. The term colloid refers to the suspension of abrasive particles in the liquid carrier. Colloidal stability refers to the maintenance of that suspension through time. In the context of the invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). More preferably, the value of $[B]-[T]/[C]$ is less than or equal to 0.3, and most preferably is less than or equal to 0.1.

The chemical-mechanical polishing composition can contain any suitable liquid carrier (e.g., solvent or dispersion medium). The liquid carrier can comprise, consist essentially of, or consist of any suitable solvent or dispersion medium, including, for example, aqueous carriers (e.g., water), non-aqueous carriers (e.g., organic solvents), or mixtures thereof. In a preferred embodiment, the liquid carrier comprises about 50% or more of water in a mixture with a non-aqueous carrier. For example, the liquid carrier can comprise about 60% or more, about 70% or more, about 80% or more, or about 90% or more of water in a mixture with a non-aqueous carrier. The water may be miscible or immiscible with the non-aqueous carrier, though preferably the water is miscible with the non-aqueous carrier. The liquid carrier preferably comprises water, and more preferably the liquid carrier is water (e.g., the liquid carrier consists of water), such as de-ionized water.

The polishing composition comprises an oxidation catalyst selected from ferrous sulfate, ferric sulfate, ferric nitrate, ferrous perchlorate, manganese (II) sulfate, manganese (II) nitrate, copper(II) sulfate, copper(II) nitrate, cobalt (II) sulfate, cobalt (II) nitrate, nickel (II) sulfate, nickel (II) nitrate, zinc (II) sulfate, zinc (II) nitrate, and combinations thereof. The polishing composition can comprise any suitable amount of the oxidation catalyst. Typically, the polishing composition can comprise about 1 ppm or more, e.g., about 5 ppm or more, about 10 ppm or more, about 25 ppm or more, about 50 ppm or more, about 75 ppm or more, or about 100 ppm or more, of the oxidation catalyst. Alternatively, or in addition, the polishing composition can comprise about 500 ppm or less, e.g., about 400 ppm or less, about 300 ppm or less, or about 200 ppm or less, of the oxidation catalyst. Thus, the polishing composition can comprise the oxidation catalyst in amounts bounded by any two of the above endpoints recited for the oxidation catalyst. For example the polishing composition can comprise about 1 ppm to about 500 ppm, e.g., about 5 ppm to about 400 ppm, about 10 ppm to about 300 ppm, about 25 ppm to about 200 ppm, about 25 ppm to about 100 ppm, or about 50 ppm to about 100 ppm, of the oxidation catalyst.

The polishing composition comprises a non-transition metal sulfate salt. The non-metallic sulfate salt can be any suitable non-transition metal sulfate salt. The non-transition metal sulfate salt desirably is an inorganic sulfate salt, i.e., the inorganic sulfate salt does not contain an alkyl or aryl substituent. The non-transition metal sulfate salt as used in the preparation of the polishing composition can be a monobasic sulfate salt or a dibasic sulfate salt, or a combination thereof. It will be understood that the sulfate salt when in aqueous solution will be diprotonated, monoprotonated, or nonprotonatated, depending on the pH of the solution. Non-limiting examples of suitable non-transition metal sulfate salts include sodium sulfate, sodium hydrogen sulfate, potassium sulfate, potassium hydrogen sulfate, lithium sulfate, lithium hydrogen sulfate, ammonium sulfate, ammonium hydrogen sulfate, tetrabutylammonium sulfate, tetrabutylammonium hydrogen sulfate, magnesium sulfate, and aluminum sulfate. In an embodiment, the sulfate salt can be generated in situ by neutralizing sulfuric acid with a suitable base, for example, with sodium hydroxide, potassium hydroxide, or ammonium hydroxide. In an embodiment, the non-metallic sulfate salt is sodium sulfate.

When the non-transition metal sulfate salt is sodium sulfate, preferably the oxidation catalyst can be selected from ferrous sulfate, ferric sulfate, ferric nitrate, ferrous perchlorate, manganese (II) sulfate, manganese (II) nitrate, copper(II) sulfate, copper(II) nitrate, cobalt (II) sulfate, cobalt (II) nitrate, nickel (II) sulfate, nickel (II) nitrate, zinc (II) sulfate, zinc (II) nitrate, and combinations thereof. When the non-transition metal sulfate salt is other than sodium sulfate, preferably the oxidation catalyst can be selected from ferrous sulfate, ferric sulfate, ferrous perchlorate, manganese (II) sulfate, manganese (II) nitrate, copper(II) sulfate, copper(II) nitrate, cobalt (II) sulfate, cobalt (II) nitrate, nickel (II) sulfate, nickel (II) nitrate, zinc (II) sulfate, zinc (II) nitrate, and combinations thereof.

The polishing composition can comprise any suitable amount of the non-transition metal sulfate salt. For example, the polishing composition can comprise an amount of the non-transition metal sulfate salt sufficient to provide about 100 ppm or more, e.g., about 150 ppm or more, about 200 ppm or more, about 250 ppm or more, about 300 ppm or more, or about 350 ppm or more, of sulfate ion ($SO_4^{2-}$). Alternatively, or in addition, the polishing composition can comprise an amount of the non-transition metal sulfate salt sufficient to provide about 750 ppm or less, e.g., about 700 ppm or less, about 650 ppm or less, about 600 ppm or less, about 550 ppm or less, or about 500 ppm or less, of sulfate ion. Thus, the polishing composition can comprise the non-transition metal sulfate salt sufficient to provide sulfate ion in amounts bounded by any two of the above endpoints recited for the sulfate ion. For example, the polishing composition can comprise the non-transition metal sulfate salt sufficient to provide about 100 ppm to about 750 ppm, e.g., about 150 ppm to about 700 ppm, about 200 ppm to about 600 ppm, about 200 ppm to about 550 ppm, about 200 ppm to about 500 ppm, or about 250 ppm to about 500 ppm, of sulfate ion.

The polishing composition comprises a complexing agent. Desirably, the complexing agent is a complexing agent for nickel. The complexing agent can be any suitable complexing agent, especially any suitable complexing agent for nickel. The complexing agent preferably is chosen so that the polishing composition exhibits low dissolution behavior when in contact with a substrate comprising nickel-phosphorous.

Non-limiting examples of suitable complexing agents include amino acids, carboxyli acids, aminocarboxylates, triazoles, oximes, and phosphonates. Non-limiting examples of suitable amino acids include alanine, serine, threonine, cysteine, valine, leucine, proline, tyrosine, glutamic acid, aspartic acid, glycine, iminodiacetic acid, histidine, asparagine, glutamine, lysine, and arginine. Non-limiting examples of suitable carboxylic acids include acetic acid, oxalic acid, malonic acid, succinc acid, glutaric acid, phthalic acid, glycolic acid, lactic acid, malic acid, citric acid, tartaric acid, mandelic acid, salicylic acid, gallic acid, 5-sulfosalicylic acid dehydrate, 2-picolinic acid, dipicolinic acid, isonicotinic acid, hydroxyiminodisuccinic acid, and 2,3-dihydroxybenzoic acid. Non-limiting examples of suitable aminocarboxylates include ethylenediaminetetraacetic acid (EDTA), hydroxyethylethylenediaminetriacetic acid (HEDTA), nitrilotriacetic acid (NTA), and diethylenetriaminepentaacetic acid (DPTA). Non-limiting examples of suitable triazoles include benzotriazole, 1,2,4-triazole, aminotriazole, and 1,2,4-triazole-3-carboxylic acid. Non-limiting examples of suitable oximes include dimethylglyoxime, salicylaldoxime, 1,2-cyclohexanedione dioxime, 1,2,3-cyclohexanetrione trioxime, 3,4-dihydroxybenzaldoxime, anti-diphenylglyoxime, 2,2'-furildioxime, 4, nitrobenzaldehyde oxime, and salicylamidoxime. Non-limiting examples of suitable phosphonates include Dequest™ phosphonates such as Dequest™ 2000, Dequest™ 2006, Dequest™ 2010, Dequest™ 2040, Dequest™ 2046, Dequest™ 2050, Dequest™ 2060, Dequest™ 2080, Dequest™ 2090 and phosphonates such as 2-hydroxy phosphonoacetic acid (HPAA), amino tris(methylenephosphonic acid (ATMP), diethylene triamine penta(methylenephosphoric acid (DTPMP).

The polishing composition comprises any suitable amount of the complexing agent. Typically, the polishing composition can contain about 0.1 wt. % or more, e.g., about 0.2 wt. % or more, or about 0.3 wt. % or more, or about 0.4 wt. % or more, or about 0.5 wt. % or more, of the complexing agent. Alternatively, or in addition, the polishing composition can contain about 2 wt. % or less, e.g., about 1.8 wt. % or less, or about 1.6 wt. % or less, or about 1.4 wt. % or less, or about 1.2 wt. % or less, or about 1 wt. % or less, of the complexing agent. Thus, the polishing composition can comprise the complexing agent in amounts bounded by any two of the above endpoints recited for the complexing agent. For example the polishing composition can comprise about 0.1 wt. % to about 2 wt. %, about 0.2 wt. % to about 1.8 wt. %, about 0.3 wt. % to about 1.6 wt. %, about 0.4 wt. % to about 1.4 wt. %, or about 0.5 wt. % to about 1.2 wt. % of the complexing agent.

The polishing composition comprises hydrogen peroxide. The polishing composition preferably comprises about 10 wt. % or less (e.g., about 8 wt. % or less, about 6 wt. % or less, about 4 wt. % or less, or about 2 wt. % or less) of hydrogen peroxide.

The polishing composition comprises a nonionic surfactant. The nonionic surfactant can be any suitable nonionic surfactant. Non-limiting examples of suitable nonionic surfactants include polyvinyl alcohols, polyalkylene glycols, polyetheramines, polyethylene oxide/polypropylene oxide copolymers, polyacrylamide, polyvinylpyrrolidone, siloxane polyalkyleneoxide copolymers, hydrophobically modified polyacrylate copolymers, hydrophilic nonionic polymers, polysaccharides, and mixtures thereof.

In an embodiment, the nonionic surfactant is a polyvinyl alcohol. The polyvinyl alcohol can be any suitable polyvinyl alcohol and can be a linear or branched polyvinyl alcohol.

The polyvinyl alcohol can have any suitable degree of hydrolysis. The degree of hydrolysis refers to the amount of free hydroxyl groups present on the polyvinyl alcohol as compared with the sum of free hydroxyl groups and acetylated hydroxyl groups. Preferably, the polyvinyl alcohol has a degree of hydrolysis of about 50% or more, e.g., about 55% or more, about 60% or more, about 70% or more, or about 75% or more.

The polyvinyl alcohol can have any suitable molecular weight. The polyvinyl alcohol can have an average molecular weight of about 250 g/mol or more, for example, about 300 g/mol or more, about 400 g/mol or more, about 500 g/mol or more, about 600 g/mol or more, about 750 g/mol or more, about 1,000 g/mol or more, about 2,000 g/mol or more, about 3,000 g/mol or more, about 4,000 g/mol or more, about 5,000 g/mol or more, or about 7,500 g/mol or more. Alternatively, or in addition, the polyvinyl alcohol can have an average molecular weight of about 15,000 g/mol or less, for example, about 14,000 g/mol or less, about 13,000 g/mol or less, about 12,000 g/mol or less, about 11,000 g/mol or less, about 10,000 g/mol or less, about 9,000 g/mol or less, about 8,000 g/mol or less, or about 7,000 g/mol or less. Thus, the polyvinyl alcohol can have an average molecular weight bounded by any two of the aforementioned endpoints. For example, the polyvinyl alcohol can have an average molecular weight of about 250 g/mol to about 15,000 g/mol, 250 g/mol to about 14,000 g/mol, 250 g/mol to about 13,000 g/mol, 250 g/mol to about 12,000 g/mol, 250 g/mol to about 11,000 g/mol, about 250 g/mol to about 10,000 g/mol, about 250 g/mol to about 9,000 g/mol, about 250 g/mol to about 8,000 g/mol, about 250 g/mol to about 7,000 g/mol, about 1,000 g/mol to about 10,000 g/mol, about 1,000 g/mol to about 9,000 g/mol, about 2,000 g/mol to about 9,000 g/mol, about 3,000 g/mol to about 9,000 g/mol, or about 4000 g/mol to about 8,000 g/mol, and the like.

The polishing composition can comprise any suitable amount of the nonionic surfactant. The polishing composition can comprise about 0.001 wt. % or more, for example, about 0.005 wt. % or more, about 0.01 wt. % or more, about 0.025 wt. % or more, about 0.05 wt. % or more, about 0.075 wt. % or more, or about 0.1 wt. % or more, of the nonionic surfactant. Alternatively, or in addition, the polishing composition can comprise about 1 wt. % or less, for example, about 0.9 wt. % or less, about 0.8 wt. % or less, about 0.7 wt. % or less, about 0.6 wt. % or less, about 0.5 wt. % or less, about 0.4 wt. % or less, or about 0.3 wt. % or less, of the nonionic surfactant. Thus, the polishing composition can comprise the nonionic surfactant in an amount bounded by any two of the aforementioned endpoints. For example, the polishing composition can comprise about 0.001 wt. % to about 1 wt. %, about 0.01 wt. % to about 0.9 wt. %, about 0.025 wt. % to about 0.8 wt. %, about 0.05 wt. % to about 0.7 wt. %, or about 0.1 wt. % to about 0.5 wt. %, of the nonionic surfactant.

The polishing composition comprises an anionic surfactant. The anionic surfactant can be any suitable anionic surfactant. Non-limiting examples of suitable anionic surfactants include polystyrenesulfonic acid, polystyrene sulfonic acid-co-maleic acid (PSS-CO-MA), polyvinyl sulfonic acid (PVS), disodium capryloampho dipropionate (CAD); polyacrylamide (PAM), polyacrylic acid (PAA or Dequest 9020), acrylic acid-2-acrylamido-2-methylpropane sulfonic acid copolymer (AA/AMPS), copolymer of maleic, acrylic acid (MA/AA), sodium polyaspartic acid, polyepoxysuccinic acid, and polyvinylphosphonic acid.

The polishing composition can comprise any suitable amount of the anionic surfactant. For example, the polishing composition can comprise about 1 ppm or more, e.g., about 5 ppm or more, about 10 ppm or more, about 20 ppm or more, about 30 ppm or more, about 40 ppm or more, or about 50 ppm or more, of the anionic surfactant. Alternatively, or in addition, the polishing composition can comprise about 1000 ppm or less, e.g., about 900 ppm or less, about 800 ppm or less, about 700 ppm or less, about 600 ppm or less, or about 500 ppm or less, of the anionic surfactant. Thus, the polishing composition can comprise the anionic surfactant in an amount bounded by any two of the aforementioned endpoints. For example, the polishing composition can comprise about 1 ppm to about 1000 ppm, e.g., about 10 ppm to about 900 ppm, about 20 ppm to about 800 ppm, about 30 ppm to about 700 ppm, about 40 ppm to about 600 ppm, or about 50 ppm to about 500 ppm, of the anionic surfactant.

The polishing composition optionally comprises a sulfonate compound. Non-limiting examples of suitable sulfonate compounds include methanedisulfonate, hydroxymethanesulfonate, ethanesulfonate, benzenesulfonate, bezenedisulfonate, p-toluenesulfonate, cyclohexanesulfonate, lauryl sulfate salts, sodium formaldehyde bisulfate, 3-hydroxypropane-1-sulfonic acid, 2-methyl-2-propene-1-sulfonic acid, 4,5-dihydroxy-1,3-benzenedisulfonate, 1-naphthalenedisulfonate, 1,5-naphthalenedisulfonic acid disodium salt, 3-hydroxynaphthalene-2,7-disulfonic acid disodium salt.

The polishing composition can comprise any suitable amount of the sulfonate compound. The polishing composition can comprise about 0.001 wt. % or more, for example, about 0.005 wt. % or more, about 0.01 wt. % or more, about 0.025 wt. % or more, about 0.05 wt. % or more, about 0.075 wt. % or more, or about 0.1 wt. % or more, of the sulfonate compound. Alternatively, or in addition, the polishing composition can comprise about 1 wt. % or less, for example, about 0.9 wt. % or less, about 0.8 wt. % or less, about 0.7 wt. % or less, about 0.6 wt. % or less, about 0.5 wt. % or less, about 0.4 wt. % or less, or about 0.3 wt. % or less, of the sulfonate compound. Thus, the polishing composition can comprise the sulfonate compound in an amount bounded by any two of the aforementioned endpoints. For example, the polishing composition can comprise about 0.001 wt. % to about 1 wt. %, about 0.01 wt. % to about 0.9 wt. %, about 0.025 wt. % to about 0.8 wt. %, about 0.05 wt. % to about 0.7 wt. %, or about 0.1 wt. % to about 0.5 wt. %, of the sulfonate compound.

The polishing composition can have any suitable pH. Typically, the polishing composition can have a pH of about 1 or more, e.g., about 1.2 or more, about 1.4 or more, about 1.6 or more, about 1.8 or more, or about 2 or more. Alternatively, or in addition, the polishing composition can have a pH of about 5 or less, e.g., about 4.5 or less, about 4 or less, about 3.5 or less, or about 3 or less. Thus, the polishing composition can have a pH bounded by any two of the above endpoints recited for the polishing composition. For example the polishing composition can have a pH of about 1 to about 5, e.g., about 1.2 to about 5, about 1.4 to about 5, about 1.6 to about 5, or about 1.8 to about 4.

The pH of the polishing composition can be adjusted using any suitable acid or base. Non-limiting examples of suitable acids include nitric acid, sulfuric acid, phosphoric acid, and organic acids such as acetic acid. Non-limiting examples of suitable bases include sodium hydroxide, potassium hydroxide, and ammonium hydroxide.

The polishing composition is free or substantially free of a peroxydisulfate salt. Peroxydisulfate has the empirical formula: $S_2O_8^{2-}$. As used herein, the phrase "substantially free of a peroxydisulfate salt" means that the polishing composition includes no more than trace contaminant amounts of a peroxydisulfate salt, which amounts are insufficient to affect any metal removal rate obtainable with the composition during CMP. Desirably, the polishing composition contains no, or at least no detectable, peroxydisulfate salt.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, oxidation catalyst, non-transition metal sulfate salt, complexing agent, hydrogen peroxide, nonionic surfactant, anionic surfactant, etc.) as well as any combination of ingredients (e.g., abrasive, oxidation catalyst, non-transition metal sulfate salt, complexing agent, hydrogen peroxide nonionic surfactant, anionic surfactant, etc.).

For example, the abrasive can be dispersed in water. The oxidation catalyst, non-transition metal sulfate salt, complexing agent, nonionic surfactant, and anionic surfactant can then be added, and mixed by any method that is capable of incorporating the components into the polishing composition. The hydrogen peroxide can be added at any time during the preparation of the polishing composition. The polishing composition can be prepared prior to use, with one or more components, such as the hydrogen peroxide, added to the polishing composition just before use (e.g., within about 1 minute before use, or within about 1 hour before use, or within about 7 days before use). The polishing composition also can be prepared by mixing the components at the surface of the substrate during the polishing operation.

The polishing composition can be supplied as a one-package system comprising abrasive, oxidation catalyst, non-transition metal sulfate salt, complexing agent, hydrogen peroxide, nonionic surfactant, anionic surfactant, and water. Alternatively, the abrasive can be supplied as a dispersion in water in a first container, and oxidation catalyst, non-transition metal sulfate salt, complexing agent, nonionic surfactant, and anionic surfactant can be supplied in a second container, either in dry form, or as a solution or dispersion in water. The hydrogen peroxide desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). The components in the first or second container can be in dry form while the components in the other container can be in the form of an aqueous dispersion. Moreover, it is suitable for the components in the first and second containers to have different pH values, or alternatively to have substantially similar, or even equal, pH values. Other two-container, or three or more-container, combinations of the components of the polishing composition are within the knowledge of one of ordinary skill in the art.

The polishing composition of the invention also can be provided as a concentrate which is intended to be diluted with an appropriate amount of water prior to use. In such an embodiment, the polishing composition concentrate can comprise the abrasive, oxidation catalyst, non-transition metal salt, complexing agent, nonionic surfactant, anionic surfactant, and water, with or without the hydrogen peroxide, in amounts such that, upon dilution of the concentrate with an appropriate amount of water, and the hydrogen peroxide if not already present in an appropriate amount, each component of the polishing composition will be present in the polishing composition in an amount within the appropriate range recited above for each component. For example, the abrasive, oxidation catalyst, non-transition metal sulfate salt, complexing agent, nonionic surfactant, anionic surfactant can each be present in the concentration in an amount that is about 2 times (e.g., about 3 times, about 4 times, or about 5 times) greater than the concentration recited above for each component so that, when the concentrate is diluted with an equal volume of (e.g., 2 equal volumes of water, 3 equal volumes of water, or 4 equal volumes of water, respectively), along with the hydrogen peroxide in a suitable amount, each component will be present in the polishing composition in an amount within the ranges set forth above for each component. Furthermore, as will be understood by those of ordinary skill in the art, the concentrate can contain an appropriate fraction of the water present in the final polishing composition in order to ensure that other components are at least partially or fully dissolved in the concentrate.

The invention also provides a method of chemically-mechanically polishing a substrate with the polishing composition described herein. In particular, the inventive method comprises (i) contacting a substrate with a polishing pad and the chemical-mechanical polishing composition described herein, (ii) moving the polishing pad relative to the substrate with the chemical-mechanical polishing composition therebetween, and (iii) abrading at least a portion of the substrate to polish the substrate.

The substrate to be polished using the method of the invention can be any suitable substrate, especially a substrate that contains nickel-phosphorous. A preferred substrate comprises at least one layer, especially an exposed layer for polishing, comprising, consisting essentially of, or consisting of nickel-phosphorous, such that at least a portion of the nickel-phosphorous is abraded (i.e., removed) to polish the substrate. Particularly suitable substrates include, but are not limited to, memory or rigid disks, such as aluminum disks coated with nickel-phosphorous.

The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

A chemical-mechanical polishing process can be characterized in a number of ways, such as in terms of the removal rate of a substrate, the resulting surface roughness, the resulting defectivity, and the resulting edge roll-off of a substrate.

The removal rate of a substrate can be determined using any suitable technique. Examples of suitable techniques for determining the removal rate of a substrate include weighing the substrate before and after use of the inventive polishing method to determine the amount of substrate removed per unit of polishing time, which can be correlated with the removal rate in terms of thickness of substrate removed per unit of polishing time, and determining the thickness of the substrate before and after use of the inventive polishing method to directly measure the removal rate of the substrate per unit of polishing time.

Desirably, the inventive polishing composition exhibits reduced roll-off (also referred to as nib-off or dub-off) when used to polish aluminum disks coated with nickel-phosphorous. The extent of roll-off can be measured by determination of the extreme radius curvature (XRCE). The XRCE can be determined using an optical profilometer, such as the Zygo Newview 100™ (Zygo Corp., Middlefield, Conn.).

Without wishing to be bound by any particular theory, it is believed that sulfate radicals are produced from the non-metallic sulfate salt by Fenton reaction initiated by the oxidation catalyst in combination with hydrogen peroxide which produces hydroxyl radicals: $2\ M(n+1)+H_2O_2 \rightarrow M(n)+2\ HO\cdot$. The hydroxyl radicals react with sulfate to form sulfate radicals: $OH\cdot + +SO_4^- \rightarrow SO_4\cdot +OH^-$. The sulfate radicals are believed to increase nickel-phosphorous removal rate and to reduce the edge roll-off.

The following examples further illustrate the invention but, of course, should not be construed as in any way limiting its scope.

In the following examples, the substrates consisted of nickel-phosphorous-coated aluminum disks. All disks were polished using a Hamai 9B polisher and Fujibo FK1N polishing pad. 6 disks were polished in each run at a polishing composition flow rate of 450 ml/min. The post-polished disks were cleaned with an Invenpro cleaner and then dried. Weight measurement was carried out on 3 disks to determine the removal rate (RR; mg/min). Edge roll-off (XRCE) measurement was taken using a Zygo Newview 100™ instrument at 80~500 μm wavelength. 2 disks from each run were measured at 120°, 240°, and 360° of the disk (double-side), respectively.

Example 1

This example demonstrates the nickel-phosphorous removal rate and edge roll-off (as XRCE) exhibited by polishing compositions comprising oxidation catalysts.

Seven sets of six similar substrates comprising nickel-phosphorous-coated aluminum memory disks were separately polished on one side with 7 different polishing compositions (Polishing Compositions 1A-1G). Each of the polishing compositions comprised 3 wt. % of DP 5110 wet-process silica abrasive, 300 ppm of a 78% hydrolyzed polyvinyl alcohol having molecular weight of 6,000 Daltons, 250 ppm of a polystyrenesulfonic acid-co-maleic acid copolymer, glycine, HEDTA, hydrogen peroxide, and nitric acid (as pH adjustor) in water at a pH of 1.9. Polishing Composition 1A (control) did not contain an oxidation catalyst. Polishing Compositions 1B-1G further comprised 100 ppm of an oxidation catalyst as set forth in Table 1.

Following polishing, the nickel-phosphorous removal rates and XRCE were determined for each substrate. The results as averaged over each set of six substrates are set forth in Table 1.

TABLE 1

| Polishing Composition | Catalyst | Removal Rate (mg/min) | XRCE (nm) |
|---|---|---|---|
| 1A (control) | None | 13.56 | 100.38 |
| 1B (comparative) | Fe(NO$_3$)$_3$ | 16.13 | 95.96 |
| 1C (comparative) | Fe(ClO$_4$)$_2$ | 14.55 | 90.20 |
| 1D (invention) | FeSO$_4$ | 15.56 | 79.73 |
| 1E (comparative) | Mn(NO$_3$)$_2$ | 10.46 | 84.15 |
| 1F (invention) | MnSO$_4$ | 12.38 | 67.93 |
| 1G (invention) | Fe$_2$(SO$_4$)$_3$ | 13.24 | 76.48 |

As is apparent from the results set forth in Table 1, substrates polished with Polishing Compositions 1D, 1F and 1G, which contained ferrous sulfate, manganese (II) sulfate, and ferric sulfate, respectively, desirably had XRCE values that were approximately 79%, 68%, and 76%, respectively, as compared with substrates polished with Polishing Composition 1A, which did not contain an oxidation catalyst. Substrates polished with Polishing Composition 1D, which contained ferrous sulfate, had an average XRCE value that was approximately 83% and 88%, respectively, of the average XRCE value of substrates polished with Polishing Compositions 1B and 1C, which contained ferric nitrate and ferrous perchlorate, respectively. Substrates polished with Polishing Composition 1G, which contained ferric sulfate, had an average XRCE value that was approximately 80% and 85%, respectively, of the average XRCE value of substrates polished with Polishing Compositions 1B and 1C. Substrates polished with Polishing Composition 1F, which contained manganese (II) sulfate, had an average XRCE value that was approximately 81% of the average XRCE value of substrates polished with Polishing Composition 1E, which contained manganese (II) nitrate.

Example 2

This example demonstrates the nickel-phosphorous removal rate and edge roll-off (as XRCE) exhibited by polishing compositions comprising oxidation catalysts.

Four sets of six similar substrates comprising nickel-phosphorous-coated aluminum memory disks were separately polished on one side with 4 different polishing compositions (Polishing Compositions 2A-2D). Each of the polishing compositions comprised 1 wt. % alpha alumina, 0.25 wt. % fumed alumina, 1.5 wt. % of wet-process silica, malonic acid, hydrogen peroxide, and nitric acid (as pH adjustor) in water at a pH of 2.2. Polishing Composition 2A (control) did not contain an oxidation catalyst. Polishing Compositions 2B (comparative), 2C (invention), and 2D (invention) further comprised 100 ppm of ferric nitrate, ferrous sulfate, and ferric sulfate, respectively.

Following polishing, the nickel-phosphorous removal rates and XRCE were determined for each substrate. The results as averaged over each set of six substrates are set forth in Table 2.

TABLE 2

| Polishing Composition | Catalyst | Removal Rate (mg/min) | XRCE (nm) |
|---|---|---|---|
| 2A (control) | None | 32.11 | 23.70 |
| 2B (comparative) | Fe(NO$_3$)$_3$ | 32.81 | 36.81 |
| 2C (invention) | FeSO$_4$ | 28.97 | 23.14 |
| 2D (invention) | Fe$_2$(SO$_4$)$_3$ | 24.64 | 21.62 |

As is apparent from the results set forth in Table 2, substrates polished with Polishing Compositions 2C and 2D, which contained ferrous sulfate and ferric sulfate, respectively, desirably had average XRCE values that were approximately 63% and 59%, respectively, as compared with substrates polished with Polishing Composition 2B, which contained ferric nitrate.

Example 3

This example demonstrates the nickel-phosphorous removal rate and edge roll-off (as XRCE) exhibited by polishing compositions comprising oxidation catalysts and sulfate ion.

Eight sets of six similar substrates comprising nickel-phosphorous-coated aluminum memory disks were separately polished on one side with 8 different polishing compositions (Polishing Compositions 3A-3H). Each of the polishing compositions comprised 3 wt. % of DP 5110 wet-process silica abrasive, 300 ppm of a 78% hydrolyzed polyvinyl alcohol having molecular weight of 6,000 Daltons, 250 ppm of a polystyrenesulfonic acid-co-maleic acid copolymer, glycine, HEDTA, hydrogen peroxide, and nitric acid (as pH adjustor) in water at a pH of 1.9. Polishing Composition 3A (control) did not contain an oxidation catalyst or sodium sulfate. Polishing Compositions 3B-3E further comprised 100 ppm of manganese (II) nitrate and sulfate ion (provided by sodium sulfate) in amounts as set forth in Table 3. Polishing Compositions 3F-3H further comprised 100 ppm of ferric sulfate and sulfate ion (provided by sodium sulfate) in amounts as set forth in Table 3.

Following polishing, the nickel-phosphorous removal rates and XRCE were determined for each substrate. The results as averaged over each set of six substrates are set forth in Table 3.

TABLE 3

| Polishing Composition | Catalyst | SO$_4$- (ppm) Provided by Non-metallic Sulfate Salt | Removal Rate (mg/min) | XRCE (nm) |
|---|---|---|---|---|
| 3A (control) | None | None | 9.13 | 88.83 |
| 3B (invention) | Mn(NO$_3$)$_2$ | 87.5 | 9.47 | 83.15 |
| 3C (invention) | Mn(NO$_3$)$_2$ | 175 | 9.54 | 76.03 |
| 3D (invention) | Mn(NO$_3$)$_2$ | 350 | 10.44 | 64.94 |
| 3E (invention) | Mn(NO$_3$)$_2$ | 700 | 10.91 | 72.40 |
| 3F (comparative) | Fe$_2$(SO$_4$)$_3$ | None | 10.88 | 90.39 |
| 3G (invention) | Fe$_2$(SO$_4$)$_3$ | 175 | 14.75 | 75.30 |
| 3H (invention) | Fe$_2$(SO$_4$)$_3$ | 350 | 15.17 | 68.14 |

As is apparent from the results set forth in Table 3, substrates polished with Polishing Composition 3D, which contained 350 ppm of sodium sulfate and 100 ppm of manganese (II) nitrate, desirably had an average XRCE value that was approximately 73% of the average XRCE value of substrates polished with the control Polishing Composition 3A, and a nickel-phosphorous removal rate that desirably was approximately 14% greater than the removal rate exhibited by Polishing Composition 3A. Substrates polished with Polishing Composition 3H, which contained 350 ppm of sodium sulfate and 100 ppm of ferric sulfate, desirably had an average XRCE value that was approximately 77% of the average XRCE value of substrates polished with the control Polishing Composition 3A, and a nickel-phosphorous removal rate that desirably was approximately 66% greater than the removal rate exhibited by Polishing Composition 3A.

The results set forth in Table 3 also show that the XRCE achieved with polishing compositions containing manganese (II) nitrate is lowest with a sulfate ion content of 350 ppm. The relationship of XRCE to sulfate ion content for Polishing Compositions 3A-3E is depicted in the Figure.

Example 4

This example demonstrates the nickel-phosphorous removal rate and edge roll-off (as XRCE) exhibited by polishing compositions comprising sulfate ion and no oxidation catalyst.

Four sets of six similar substrates comprising nickel-phosphorous-coated aluminum memory disks were separately polished on one side with 4 different polishing compositions (Polishing Compositions 4A-4D). Each of the polishing compositions comprised 3 wt. % of DP 5110 wet-process silica abrasive, 300 ppm of a 78% hydrolyzed polyvinyl alcohol having molecular weight of 6,000 Daltons, 250 ppm of a polystyrenesulfonic acid-co-maleic acid copolymer, glycine, HEDTA, hydrogen peroxide, and nitric acid (as pH adjustor) in water at a pH of 1.9. Polishing Composition 4A did not contain sulfate ion. Polishing Compositions 4B-4D further contained 175, 350, and 525 ppm of sulfate ion (as provided by sodium sulfate).

Following polishing, the nickel-phosphorous removal rates and XRCE were determined for each substrate. The results as averaged over each set of six substrates are set forth in Table 4.

TABLE 4

| Polishing Composition | SO$_4$- (ppm) | XRCE (nm) |
|---|---|---|
| 4A | None | 89.93 |
| 4B | 175 | 89.56 |
| 4C | 350 | 93.06 |
| 4D | 525 | 90.82 |

As is apparent from the results set forth in Table 4, none of the substrates polished with Polishing Compositions 4B-4D, which contained sulfate ion but did not contain an oxidation catalyst, exhibited an improvement in XRCE as compared with substrates polished with Polishing Composition 4A, which did not contain sulfate ion or an oxidation catalyst.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) an abrasive selected from wet-process silica, alpha alumina, fumed alumina, ceria, zirconia, titania, and combinations thereof,
   (b) an oxidation catalyst selected from ferrous sulfate, ferric sulfate, ferrous perchlorate, manganese (II) sulfate, manganese (II) nitrate, copper(II) sulfate, copper (II) nitrate, cobalt (II) sulfate, cobalt (II) nitrate, nickel (II) sulfate, nickel (II) nitrate, zinc (II) sulfate, zinc (II) nitrate, and combinations thereof,
   (c) a non-transition metal sulfate salt,
   (d) a complexing agent,
   (e) hydrogen peroxide,
   (f) a nonionic surfactant,
   (g) an anionic surfactant, and
   (h) water,
   wherein the polishing composition has a pH of about 1 to about 5, and wherein the polishing composition is substantially free of a peroxydisulfate salt.

2. The polishing composition of claim 1, wherein the oxidation catalyst is present in an amount sufficient to provide about 1 ppm to about 500 ppm of metal cation.

3. The polishing composition of claim 1, wherein the non-metallic sulfate salt is sodium sulfate, and wherein the sodium sulfate is present in an amount of about 50 ppm to about 700 ppm.

4. The polishing composition of claim 1, wherein the complexing agent is glycine, hydroxyethylethylenediamine triacetic acid, or a combination thereof.

5. The polishing composition of claim 1, wherein the nonionic surfactant is polyvinylalcohol.

6. The polishing composition of claim 1, wherein the anionic surfactant is selected from the group consisting of polystyrenesulfonic acid, polystyrene sulfonic acid-co-maleic acid (PSS-CO-MA), polyvinyl sulfonic acid (PVS), disodium capryloampho dipropionate (CAD); polyacrylamide (PAM), polyacrylic acid (PAA or Dequest 9020), acrylic acid-2-acrylamido-2-methylpropane sulfonic acid copolymer (AA/AMPS), copolymer of maleic, acrylic acid (MA/AA), sodium polyaspartic acid, polyepoxysuccinic acid, and polyvinylphosphonic acid.

7. A chemical-mechanical polishing composition comprising:
   (a) an abrasive selected from wet-process silica, alpha alumina, fumed alumina, ceria, zirconia, titania, and combinations thereof,
   (b) an oxidation catalyst selected from ferrous sulfate, ferric sulfate, ferric nitrate, ferrous perchlorate, manganese (II) sulfate, manganese (II) nitrate, copper(II) sulfate, copper(II) nitrate, cobalt (II) sulfate, cobalt (II) nitrate, nickel (II) sulfate, nickel (II) nitrate, zinc (II) sulfate, zinc (II) nitrate, and combinations thereof,
   (c) sodium sulfate,
   (d) a complexing agent,
   (e) hydrogen peroxide,
   (f) a nonionic surfactant,
   (g) an anionic surfactant, and
   (h) water,
   wherein the polishing composition has a pH of about 1 to about 5, and wherein the polishing composition is substantially free of a peroxydisulfate salt.

8. The polishing composition of claim 7, wherein the oxidation catalyst is present in amount sufficient to provide about 1 ppm to about 500 ppm of metal cation.

9. The polishing composition of claim 7, wherein the sodium sulfate is present in an amount of about 50 ppm to about 700 ppm.

10. The polishing composition of claim 7, wherein the complexing agent is glycine, hydroxyethylethylenediamine triacetic acid, or a combination thereof.

11. The polishing composition of claim 7, wherein the nonionic surfactant is polyvinylalcohol.

12. The polishing composition of claim 7, wherein the anionic surfactant comprises a sulfonic acid group and a carboxylic acid group.

13. A method of chemically-mechanically polishing a substrate comprising:
   (i) contacting a substrate with a polishing pad and a chemical-mechanical polishing composition comprising:
      (a) an abrasive selected from wet-process silica, alpha alumina, fumed alumina, ceria, zirconia, titania, and combinations thereof,
      (b) an oxidation catalyst selected from ferrous sulfate, ferric sulfate, ferrous perchlorate, manganese (II) sulfate, manganese (II) nitrate, copper(II) sulfate, copper (II) nitrate, cobalt (II) sulfate, cobalt (II) nitrate, nickel (II) sulfate, nickel (II) nitrate, zinc (II) sulfate, zinc (II) nitrate, and combinations thereof,
      (c) a non-transition metal sulfate salt,
      (d) a complexing agent,
      (e) hydrogen peroxide,
      (f) a nonionic surfactant,
      (g) an anionic surfactant, and
      (h) water,
   wherein the polishing composition has a pH of about 1 to about 5, and wherein the polishing composition is substantially free of a peroxydisulfate salt,
   (ii) moving the polishing pad and the chemical-mechanical polishing composition relative to the substrate, and
   (iii) abrading at least a portion of the substrate to polish the substrate.

14. The method of claim 13, wherein the oxidation catalyst is present in amount sufficient to provide about 1 ppm to about 500 ppm of metal cation.

15. The method of claim 13, wherein the non-metallic sulfate salt is sodium sulfate, and wherein the sodium sulfate is present in an amount of about 50 ppm to about 700 ppm.

16. The method of claim 13, wherein the complexing agent is glycine, hydroxyethylethylenediamine triacetic acid, or a combination thereof.

17. The method of claim 13, wherein the nonionic surfactant is polyvinylalcohol.

18. The method of claim 13, wherein the anionic surfactant comprises a sulfonic acid group and a carboxylic acid group.

19. The method of claim 13, wherein the substrate is a nickel-phosphorous-coated aluminum memory disk, and wherein at least a portion of the nickel-phosphorous is removed to polish the substrate.

20. A method of chemically-mechanically polishing a substrate comprising:
   (i) contacting a substrate with a polishing pad and a chemical-mechanical polishing composition comprising:
      (a) an abrasive selected from wet-process silica, alpha alumina, fumed alumina, ceria, zirconia, titania, and combinations thereof,
      (b) an oxidation catalyst selected from ferrous sulfate, ferric sulfate, ferric nitrate, ferrous perchlorate, manganese (II) sulfate, manganese (II) nitrate, copper(II)

sulfate, copper(II) nitrate, cobalt (II) sulfate, cobalt (II) nitrate, nickel (II) sulfate, nickel (II) nitrate, zinc (II) sulfate, zinc (II) nitrate, and combinations thereof,
(c) sodium sulfate,
(d) a complexing agent,
(e) hydrogen peroxide,
(f) a nonionic surfactant,
(g) an anionic surfactant, and
(h) water, wherein the polishing composition has a pH of about 1 to about 5, and wherein the polishing composition is substantially free of a peroxydisulfate salt, (ii) moving the polishing pad and the chemical-mechanical polishing composition relative to the substrate, and
(iii) abrading at least a portion of the substrate to polish the substrate.

21. The method of claim 20, wherein the oxidation catalyst is present in amount sufficient to provide about 1 ppm to about 500 ppm of metal cation.

22. The method of claim 20, wherein the sodium sulfate is present in an amount of about 50 ppm to about 700 ppm.

23. The method of claim 20, wherein the complexing agent is glycine, hydroxyethylethylenediamine triacetic acid, or a combination thereof.

24. The method of claim 20, wherein the nonionic surfactant is polyvinylalcohol.

25. The method of claim 20, wherein the anionic surfactant comprises a sulfonic acid group and a carboxylic acid group.

26. The method of claim 20, wherein the substrate is a nickel-phosphorous-coated aluminum memory disk, and wherein at least a portion of the nickel-phosphorous is removed to polish the substrate.

* * * * *